(12) United States Patent
Ruf et al.

(10) Patent No.: US 12,043,127 B2
(45) Date of Patent: Jul. 23, 2024

(54) SUPPLY DEVICE, FUEL CELL VEHICLE, AND METHOD FOR LIMITING VOLTAGE IN A SUPPLY DEVICE

(71) Applicant: AUDI AG, Ingolstadt (DE)

(72) Inventors: Markus Ruf, Waldstetten (DE); Kai Müller, Bretzfeld (DE)

(73) Assignee: AUDI AG, Ingolstadt (DE)

( * ) Notice: Subject to any disclaimer, the term of this patent is extended or adjusted under 35 U.S.C. 154(b) by 92 days.

(21) Appl. No.: 17/775,841

(22) PCT Filed: Dec. 14, 2020

(86) PCT No.: PCT/EP2020/085889
§ 371 (c)(1),
(2) Date: May 10, 2022

(87) PCT Pub. No.: WO2021/148197
PCT Pub. Date: Jul. 29, 2021

(65) Prior Publication Data
US 2022/0388406 A1  Dec. 8, 2022

(30) Foreign Application Priority Data
Jan. 23, 2020  (DE) ............... 10 2020 101 527.5

(51) Int. Cl.
*B60L 50/75* (2019.01)
*B60L 3/00* (2019.01)
(Continued)

(52) U.S. Cl.
CPC ............ *B60L 50/75* (2019.02); *B60L 50/72* (2019.02); *B60L 58/40* (2019.02); *G01R 31/389* (2019.01);
(Continued)

(58) Field of Classification Search
CPC ...... B60L 3/0053; B60L 3/0069; B60L 50/71; B60L 50/72; B60L 50/75; B60L 58/30;
(Continued)

(56) References Cited

U.S. PATENT DOCUMENTS 6,781,343 B1 * 8/2004 Demachi ............... B60L 58/34
320/101
2004/0033398 A1 * 2/2004 Kearl ............... H01M 8/04955
429/432

(Continued)

FOREIGN PATENT DOCUMENTS

CN  109606203 A  4/2019
DE  10010985 A1  9/2001
(Continued)

OTHER PUBLICATIONS

International Preliminary Report on Patentability, dated Aug. 16, 2021, for International Application No. PCT/EP2020/085889. (5 pages) (English Translation).

*Primary Examiner* — Steven L Yeninas
(74) *Attorney, Agent, or Firm* — Seed IP Law Group LLP

(57) ABSTRACT

A supply device for supplying electricity to at least one consumer includes: a primary power supply in which there is a first fuel cell device having a first performance; a voltage transformer which connects the primary power supply to a secondary power supply having a battery; and a measuring device for detecting an insulation resistance of the primary power supply and/or of the secondary power supply. A second fuel cell device having a second performance is connected in series with the first fuel cell device in the primary power supply, wherein a bridge circuit comprising a switch is connected in parallel with each of the fuel cell devices and wherein the switches of the bridge circuits can be switched in accordance with the detected insulation
(Continued)

resistance. A fuel cell vehicle and a method for limiting voltage in a supply device are also provided.

11 Claims, 1 Drawing Sheet

(51) Int. Cl.
| | |
|---|---|
| *B60L 50/72* | (2019.01) |
| *B60L 58/40* | (2019.01) |
| *G01R 27/02* | (2006.01) |
| *G01R 31/389* | (2019.01) |
| *H01M 8/04537* | (2016.01) |

(52) U.S. Cl.
CPC ... *H01M 8/04544* (2013.01); *H01M 8/04634* (2013.01); *B60L 3/0069* (2013.01); *G01R 27/025* (2013.01); *H01M 2250/20* (2013.01)

(58) Field of Classification Search
CPC ..... B60L 58/40; G01R 27/025; G01R 31/389; H01M 8/04544; H01M 8/04634; H01M 16/006; H01M 2250/20; Y02E 60/50; Y02T 90/40
See application file for complete search history.

(56) References Cited

U.S. PATENT DOCUMENTS

| | | | |
|---|---|---|---|
| 2008/0107933 A1 | 5/2008 | Gallagher | |
| 2008/0220301 A1* | 9/2008 | LaBreche | H01M 8/243 |
| | | | 429/430 |
| 2017/0162924 A1 | 6/2017 | Yoon | |
| 2018/0219238 A1* | 8/2018 | Tanaka | H01M 8/2465 |
| 2020/0067119 A1* | 2/2020 | Ito | H01M 8/04873 |

FOREIGN PATENT DOCUMENTS

| | | |
|---|---|---|
| DE | 102013012151 A1 | 1/2015 |
| DE | 102016219984 A1 | 12/2017 |

* cited by examiner

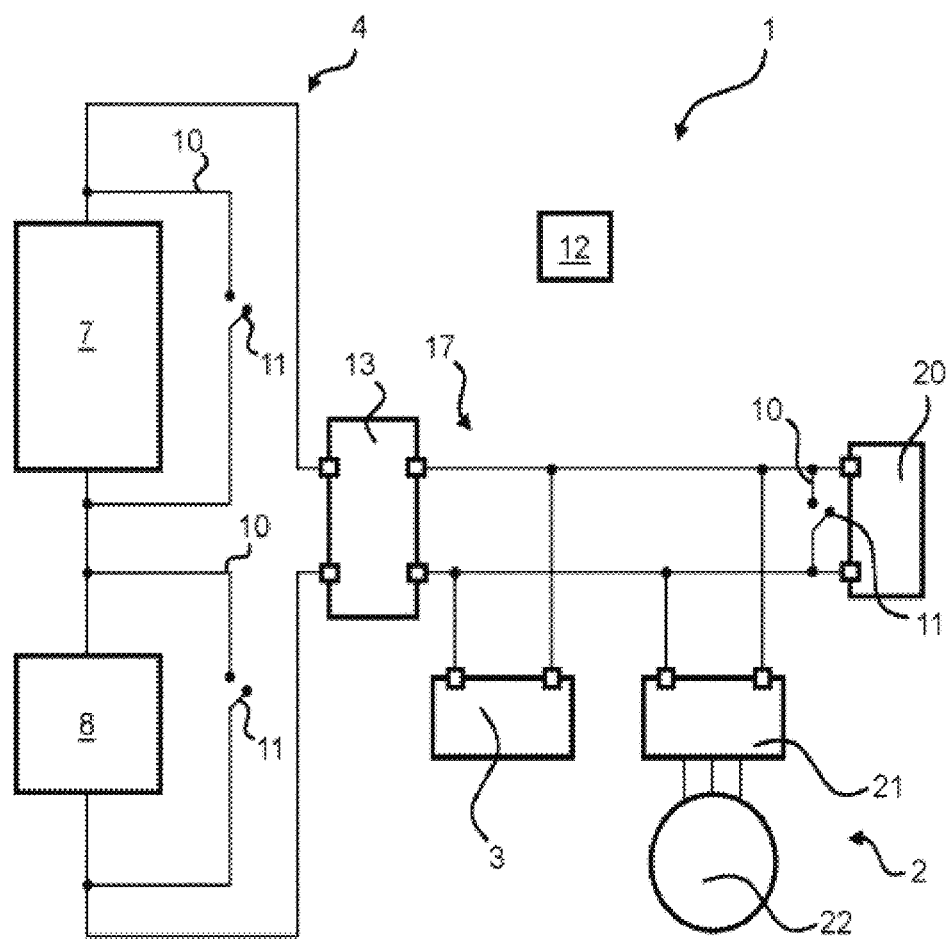

SUPPLY DEVICE, FUEL CELL VEHICLE, AND METHOD FOR LIMITING VOLTAGE IN A SUPPLY DEVICE

BACKGROUND

Technical Field

Embodiments of the invention relate to a supply device for supplying electricity to at least one consumer, said supply device comprising: a primary power supply in which there is a first fuel cell device having a first performance; a voltage transformer which connects the primary power supply to a secondary power supply having a battery; and at least one measuring device for detecting an insulation resistance of the power supply, in particular of the primary power supply and/or of the secondary power supply. Embodiments of the invention also relate to a fuel cell vehicle having a supply device, and to a method for limiting voltage in a supply device when supplying electricity to a consumer.

Description of the Related Art

Such supply devices are typically employed in fuel cell vehicles, with the insulation resistance for such electrically powered vehicles typically having to be 100 ohms/volt in relation to the highest voltage that occurs in order to protect people from electrocution that is dangerous for them.

A supply device is shown in DE 102016219984 A1. In this case, the insulation resistance of the hybrid fuel cell vehicle formed from a fuel cell device and a battery is determined by means of a plurality of measuring devices. In accordance with the determined value of the insulation resistance, the fuel cell vehicle is put into an emergency drive mode or even into an idle-stop mode in order to protect against dangerous electrocution.

US 2008/0 107 933 A1 describes a fuel cell system which, in accordance with the load requirement made, activates or deactivates a different number of fuel cell stacks to provide power.

US 2017/0 162 924 A1 describes a fuel cell system which monitors the voltage supplied by the fuel cell stack and switches to emergency operation when a limit voltage of the entire system is exceeded.

CN 109 606 203 A describes a method for operating a system formed with a battery and a fuel cell device, which causes an emergency shutdown in the event of critical events.

BRIEF SUMMARY

Some embodiments specify a supply device, a fuel cell vehicle and a method for limiting voltage, which offer increased safety.

A supply device is characterized in particular by the fact that a second fuel cell device having a second performance, that may be different from the first performance, is connected in series with the first fuel cell device in the primary power supply, so that a bridge circuit comprising a switch is connected in parallel with each of the fuel cell devices, and that the switches of the bridge circuits can be switched in accordance with the detected insulation resistance.

If, for example, two fuel cell devices with different performance are employed, it can be ensured that the voltage is reduced to a level that is not dangerous for humans due to the existing insulation resistance, since only the fuel cell device provides power that has a low voltage. The dynamic behavior of the still active fuel cell device, i.e., the situation-adapted setting of the load point, can be limited in this emergency mode. A fuel cell vehicle using the supply device can still be operated or driven further in an emergency driving mode ("limp home") with reduced power, whereby it is not necessary to put the fuel cell vehicle into a stop mode and prevent it from continuing to drive.

In order to limit the voltage of the supply device, in particular its output voltage, to a value that is harmless to humans and thus raise the insulation resistance to or above a specified resistance value, the battery in the secondary power supply may also have a bridge circuit connected in parallel which comprises a switch that can be switched in accordance with the detected insulation resistance.

It is possible that the voltage transformer for setting the voltage level of the first fuel cell device, the voltage level of the second fuel cell device and the voltage level of the battery is formed as a triport transformer. Thus, the triport transformer can ensure that the insulation resistance does not fall below a predetermined resistance value, which could result in electrocution dangerous to humans. For this purpose, the insulation resistance is first determined by means of the measuring device, from which the maximum possible voltage for the supply device is calculated, that is safe for humans. The individual voltages of the fuel cell devices and the battery are then set and, if necessary, matched to one another in such a way that this maximum voltage value is not exceeded.

In order to be able to provide usable power scaling for different applications, at least one further fuel cell device with an associated bridge circuit comprising a switch may be present in the primary power supply and may be connected in series with the other fuel cell devices.

The advantages, technical effects and advantageous configurations explained in connection with the supply device apply equally to the fuel cell vehicles. Said fuel cell vehicle is characterized by the fact that in the event that the insulation resistance is too low, it is still possible to continue driving with reduced power and an emergency shutdown is avoided.

A method for limiting voltage of a preceding supply device when supplying electricity to a consumer comprises in particular the following steps:

A. detecting the insulation resistance in the primary power supply and/or in the secondary power supply by means of the measuring device,
B. checking whether the insulation resistance has not reached a specified resistance value, and
C. in the event of a resistance value not being reached, actuating one or more switches of the bridge circuits in such a way that at least one of the fuel cell devices is bridged and thus, at least partially, or completely deactivated, and that another of the fuel cell devices is not bridged and is thus activated to provide a voltage.

In this method the first fuel cell device may have a first performance, and the second fuel cell device may have a second performance that is different from the first performance, and in the event of a resistance value not being reached the fuel cell device with the higher performance is bridged.

This ensures an emergency supply of the consumer with reduced power, so that an emergency shutdown of the consumer is avoided.

In the event of a resistance value not being reached, the state of charge (SOC) of the battery may be reduced, since in this way the voltage of the supply device is reduced overall.

If simply lowering the voltage level of the battery is not sufficient to raise the insulation resistance to a specified resistance value, there is the option of also connecting a bridge circuit in parallel with the battery in the secondary power supply, which bridge circuit has a switch that can be switched in accordance with the insulation resistance detected, and that the battery is also bridged in the event of a resistance value not being reached and is deactivated.

In order to increase the operational reliability of the supply device, the voltage transformer may be formed as a triport transformer if, in the event of a resistance value not being reached, the triport transformer reduces the voltage level of the first fuel cell device, the voltage level of the second fuel cell device and/or the voltage level of the battery. This triport transformer can therefore set the voltage levels of all constituents to a value that is harmless to humans, in accordance with the existing insulation resistance and the resulting maximum voltage of the supply device.

The features and feature combinations mentioned above in the description and the features and feature combinations mentioned below in the description of the figures and/or shown alone in the FIGURES can be used not only in the combination specified in each case, but also in other combinations or on their own. Embodiments of the invention therefore also encompass embodiments that are not explicitly shown or explained in the FIGURES, but that emerge from the explained embodiments and can be generated through separate combinations of features.

BRIEF DESCRIPTION OF THE SEVERAL VIEWS OF THE DRAWINGS

Further advantages, features and details are evident from the claims, the following description and the drawing.

FIG. 1 shows a schematic representation of a supply device for the electrical supply of at least one consumer in the form of a drive device with a drive unit for driving a motor vehicle.

DETAILED DESCRIPTION

FIG. 1 shows a schematic representation of a supply device 1 for the electrical supply of a first consumer 2 and a second consumer 3. The present supply device 1 can also supply electrical energy to other consumers, not shown in detail.

The supply device 1 comprises a primary power supply 4, in which there is a first fuel cell device 7 and a second fuel cell device 8, which are connected to one another in series. In addition, the supply device 1 has a secondary power supply 17 in which there is a battery 20. The battery 20 is designed to energize the consumers 2, 3. The primary power supply 4 is connected to a voltage transformer 13 on the input side, with the secondary power supply 17 in the present case being connected to the voltage transformer 13 on the output side, so that the voltage transformer 13 connects the primary power supply 4 with the secondary power supply 17.

The consumer 2 comprises a drive unit 22, which is in the form of an electrical machine. This electrical machine is typically operable by means of a three-phase alternating current and may be formed as a traction motor for a motor vehicle. Since the primary power supply 4 and also the secondary power supply 17 supply a high voltage and a direct current, the inverter 21 is additionally assigned to the consumer 2, said inverter 21 converting the direct current into the three-phase alternating current. In a further development of the consumer 2, the drive unit 22 can also be used as a generator, so that energy generated by the drive unit 22 can be fed back to the battery 20 via the inverter 21 during the braking process, for example.

The consumer 3 can also be connected to the vehicle electrical system formed from primary power supply 4 and secondary power supply 17. Possible consumers 3 include, for example, ancillary units of the fuel cell device 7, a charger, a 12 V DC/DC transformer, a high-voltage heater, an electric air-conditioning compressor or the like.

The present supply device 1 is characterized by a plurality of bridge circuits 10 comprising a switch 11 in each case. A bridge circuit 10 is connected in parallel with each of the fuel cell devices 7, 8 in the primary power supply 4 in order to, optionally, either electrically bridge the fuel cell device 7, 8 and deactivate it when the switch 11 is closed, or to activate the relevant fuel cell device 7, 8 when the switch 11 is open, so that it provides an electrical voltage. In the example shown, a bridge circuit 10 with a switch 11 is also connected in parallel with the battery 20, with which the battery 20 is electrically bridged when the switch 11 is closed and deactivated, and with which the battery 20 is activated when the switch 11 is open, so that it can provide or absorb an electrical voltage.

The switch 11 is actuated, for example, by means of the voltage transformer 13, which is formed, for example, as a triport transformer so that it can set the voltage level of the first fuel cell device 7, the second fuel cell device 8 and the battery 20. However, there can be another controller—separate from the voltage transformer 13—to actuate the bridge circuits 10 and employed.

The supply device 1 comprises a measuring device 12 for detecting an insulation resistance of the primary power supply 4 and/or the secondary power supply 17. The measuring device 12 shown may detect the insulation resistance of the entire supply device 1, and therefore of the entire system. There can be a plurality of measuring devices 12, so that a first measuring device 12 detects the insulation resistance of the primary power supply 4 and a second measuring device detects the insulation resistance of the secondary power supply 17.

When the supply device 1 is in operation, it is ensured that its insulation resistance does not drop below a value that is dangerous for humans. For this reason, the insulation resistance in the primary power supply 4 and/or in the secondary power supply 17 is clocked or continuously detected by the measuring device 12. It is then checked whether the insulation resistance has reached a predetermined resistance value or not, with, in the event of a resistance value not being reached, one or more of the switches 11 of the bridge circuits 10 being actuated and switched in such a way that the fuel cell device 7, 8 with a greater performance is bridged and thus completely deactivated, and the fuel cell device 7, 8 with a lower performance is not bridged and is thus activated to provide a voltage.

In the event of a resistance value not being reached, the state of charge (SOC) of the battery 20 may be reduced also. If reducing is not enough to achieve the desired insulation value of the system, then, bridge circuit 10 associated with the battery 20 can be utilized. Then, the battery 20 is likewise bridged and thus deactivated in the event that the resistance value is still not reached despite the SOC being reduced.

The corresponding position of switches 11 in the primary power supply 4 and/or switches 11 in the secondary power supply 17 can ensure that the insulation resistance is increased to a value that is not dangerous for humans and that a fuel cell vehicle using the supply device can still be operated in an emergency driving mode ("limp home" mode). It is therefore possible to continue driving. In this way it is therefore not necessary to put the fuel cell vehicle into a stop mode and to prevent it from continuing to drive or from continuing to operate.

The method described above and the supply device 1 described above offer a high level of operational reliability while at the same time having a compact design for all the constituents involved. Therefore, the same also applies to a drive device of a fuel cell vehicle, which is supplied with electrical energy by such a supply device 1.

Aspects of the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A supply device for the electrical supply of at least one consumer, comprising:
   a primary power supply which there is a first fuel cell device with a first performance; and
   a voltage transformer which connects the primary power supply to a secondary power supply having a battery, and to a measuring device for detecting an insulation resistance of the primary power supply and/or of the secondary power supply,
   wherein a second fuel cell device with a second performance different than the first performance is connected in series with the first fuel cell device in the primary power supply, and
   wherein a bridge circuit comprising a switch is connected in parallel with each of the fuel cell devices, and the switches of the bridge circuits can be switched in accordance with the detected insulation resistance.

2. The supply device according to claim 1, wherein a bridge circuit is also connected in parallel with the battery in the secondary power supply and the bridge circuit comprises a switch which can be switched in accordance with the detected insulation resistance.

3. The supply device according to claim 1, wherein the voltage transformer for setting the voltage level of the first fuel cell device, the voltage level of the second fuel cell device and the voltage level of the battery is formed as a triport transformer.

4. The supply device according to claim 1, wherein in the primary power supply there is at least one further fuel cell device with an associated bridge circuit comprising a switch and which fuel cell device is connected in series with the other fuel cell devices.

5. A fuel cell vehicle with a supply device according to claim 1.

6. A method for limiting voltage in a supply device when supplying electricity to a consumer, the supply device including a primary power supply in which there is a first fuel cell device with a first performance; and a voltage transformer which connects the primary power supply to a secondary power supply having a battery, and to a measuring device for detecting an insulation resistance of the primary power supply and/or of the secondary power supply, wherein a second fuel cell device with a second performance different than the first performance is connected in comprising a switch is connected in parallel with each of the fuel cell devices, and the switches of the bride circuits can be switched in accordance with the detected insulation resistance the method comprising:
   detecting the insulation resistance in the primary power supply and/or in the secondary power supply by the measuring device;
   checking whether the insulation resistance has not reached a specified resistance value; and
   in the event of a resistance value not being reached, actuating one or more switches of the bridge circuits in such a way that at least one of the fuel cell devices is bridged and thus, at least partially deactivated, and that another of the fuel cell devices is not bridged and is thus activated to provide a voltage.

7. The method according to claim 6, wherein, in the event of a resistance value not being reached, the fuel cell device with the higher performance is bridged.

8. The method according to claim 6, wherein the state of charge (SOC) of the battery reduced if the resistance value is not reached.

9. The method according to claim 8, wherein a bridge circuit is also connected in parallel with the battery in the secondary power supply and which bridge circuit comprises a switch which can be switched in accordance with the detected insulation resistance, and that the battery is also bridged in the event of a resistance value not being reached and is thus deactivated.

10. The method according to claim 6, wherein the voltage transformer is formed as a triport transformer, that the triport transformer and, in the event of a resistance value not being reached, reduces the voltage level of the first fuel cell device, the voltage level of the second fuel cell device and/or the voltage level of the battery.

11. The method according to claim 6, wherein actuating one or more switches of the bridge circuits includes actuating one or more switches of the bridge circuits in such a way that at least one of the fuel cell devices is bridged and thus completely deactivated.

* * * * *

UNITED STATES PATENT AND TRADEMARK OFFICE
CERTIFICATE OF CORRECTION

| | | |
|---|---|---|
| PATENT NO. | : 12,043,127 B2 | |
| APPLICATION NO. | : 17/775841 | |
| DATED | : July 23, 2024 | |
| INVENTOR(S) | : Markus Ruf et al. | |

It is certified that error appears in the above-identified patent and that said Letters Patent is hereby corrected as shown below:

In the Claims

Column 5, Claim 1, Line 26:
"power supply which there"
Should read:
--power supply in which there--.

Column 6, Claim 6, Lines 12-13:
"connected in comprising a switch"
Should read:
--connected in series with the first fuel cell device in the primary power supply, and wherein a bridge circuit comprising a switch--.

Column 6, Claim 6, Line 14:
"the bride circuits"
Should read:
--the bridge circuits--.

Column 6, Claim 6, Lines 15-16:
"insulation resistance the method comprising:"
Should read:
--insulation resistance, the method comprising:--.

Column 6, Claim 8, Line 33:
"charge (SOC) of the battery reduced if the resistance value"
Should read:
--charge of the battery is reduced if the resistance value--.

Signed and Sealed this
Twenty-ninth Day of October, 2024

Katherine Kelly Vidal
*Director of the United States Patent and Trademark Office*